United States Patent …

(12) United States Patent
Ruque

(10) Patent No.: US 7,327,580 B2
(45) Date of Patent: Feb. 5, 2008

(54) ELECTRONIC BOARD DEVICE COMPRISING A RACK AND AN ELECTRONIC BOARD CHASSIS FOR INSERTION INTO THE RACK

(75) Inventor: Christian Ruque, Corbas (FR)

(73) Assignee: Alstom Transport SA, Levallois-Perret (FR)

( * ) Notice: Subject to any disclaimer, the term of this patent is extended or adjusted under 35 U.S.C. 154(b) by 0 days.

(21) Appl. No.: 11/447,492

(22) Filed: Jun. 6, 2006

(65) Prior Publication Data

US 2006/0274516 A1 Dec. 7, 2006

(30) Foreign Application Priority Data

Jun. 7, 2005 (FR) .................................. 05 05785

(51) Int. Cl.
*H05K 7/00* (2006.01)
(52) U.S. Cl. ...................... 361/760; 361/735
(58) Field of Classification Search ............... 361/796, 361/752, 756
See application file for complete search history.

(56) References Cited

U.S. PATENT DOCUMENTS

| | | | | |
|---|---|---|---|---|
| 5,761,033 A * | 6/1998 | Wilhelm | ..................... | 361/686 |
| 5,885,089 A | 3/1999 | Ruque | ..................... | 439/61 |
| 6,496,364 B1 | 12/2002 | Medin et al. | ................ | 361/686 |
| 6,608,564 B2 * | 8/2003 | Post et al. | ................ | 340/693.5 |
| 6,621,712 B2 * | 9/2003 | Siira et al. | .................. | 361/796 |
| 6,667,889 B2 * | 12/2003 | Jansen | ........................ | 361/752 |
| 6,922,336 B2 * | 7/2005 | Barsun et al. | .............. | 361/683 |
| 6,975,241 B2 * | 12/2005 | Post et al. | ................ | 340/693.5 |
| 7,116,241 B2 * | 10/2006 | Post et al. | ................ | 340/693.5 |
| 2003/0031002 A1 * | 2/2003 | Siira et al. | .................. | 361/796 |
| 2004/0042192 A1 * | 3/2004 | Davidson et al. | ........... | 361/796 |

FOREIGN PATENT DOCUMENTS

| | | |
|---|---|---|
| EP | 0 712 268 | 5/1996 |
| FR | 2 743 977 | 7/1997 |
| JP | 2003101263 | 4/2003 |

* cited by examiner

*Primary Examiner*—Tuan T. Dinh
*Assistant Examiner*—Abiy Getachew
(74) *Attorney, Agent, or Firm*—Davidson, Davidson & Kappel, LLC

(57) ABSTRACT

This device is of the type comprising a rack, a chassis that can be inserted into the rack, and at least one electronic board that can be inserted into the chassis.

According to one aspect of the invention, the chassis is arranged so as to enable the insertion of the or each board when the chassis has been inserted into the rack beforehand, and output connectors of the rack and of the or each board, and board connectors of the chassis and of the or each board are arranged so as to connect up respectively when the or each board is inserted into the chassis which has been inserted into the rack beforehand.

10 Claims, 2 Drawing Sheets

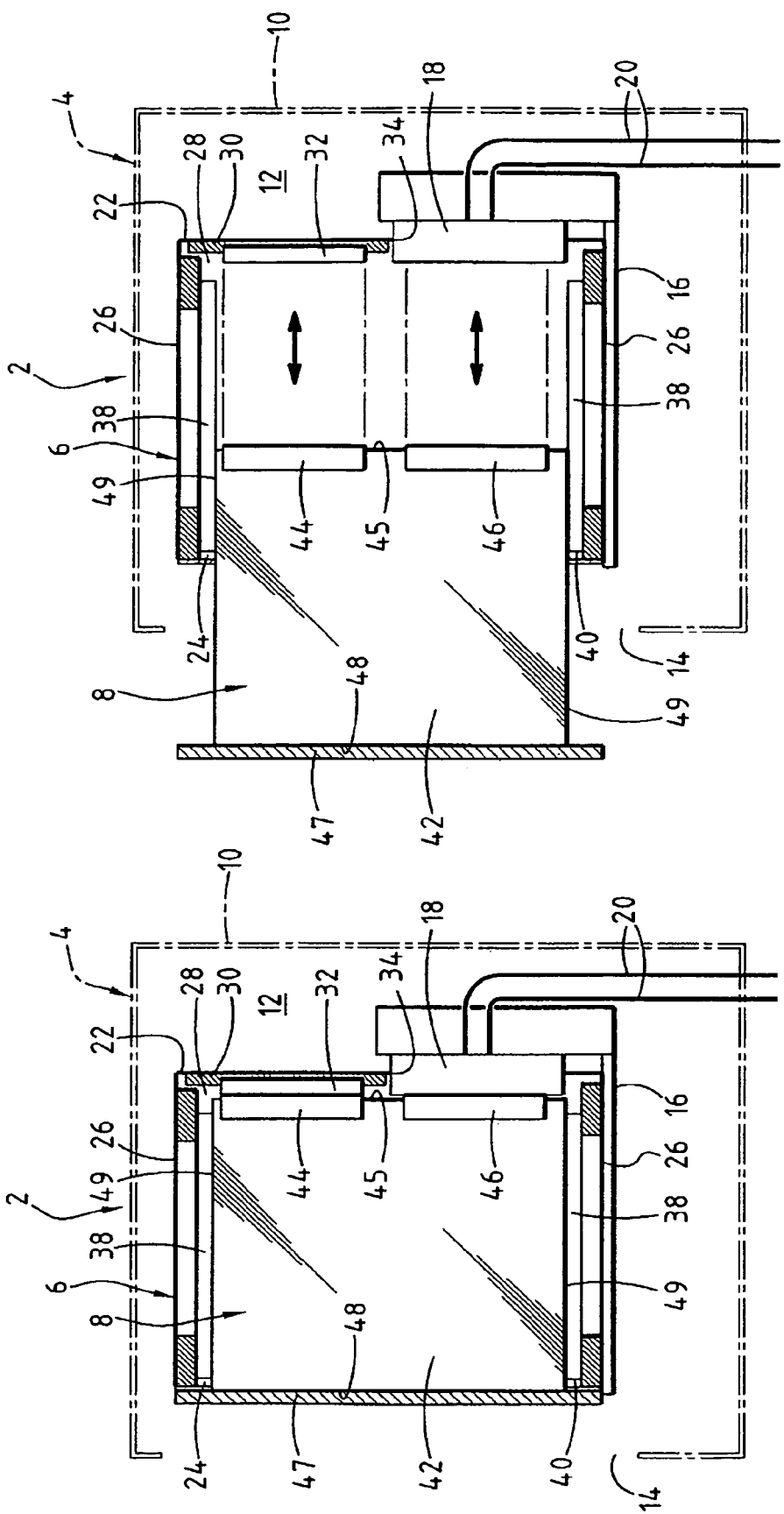

ELECTRONIC BOARD DEVICE COMPRISING A RACK AND AN ELECTRONIC BOARD CHASSIS FOR INSERTION INTO THE RACK

BACKGROUND OF THE INVENTION

The present invention relates to an electronic board device, of the type comprising:

a rack;

a chassis that can be removably inserted into the rack according to a direction of insertion of the chassis into the rack;

at least one electronic board that can be removably inserted into the chassis according to a direction of insertion of the or each board into the chassis;

at least one electrical board connector fixed to the chassis, the or each board comprising an electrical board connector adapted to be connected up with the or each board connector of the chassis when the or each board is inserted into the chassis; and at least one electrical output connector fixed to the rack, the or each board comprising an electrical output connector adapted to be connected up with the or each output connector of the rack, when, the or each board having been inserted into the chassis beforehand, the chassis is inserted into the rack.

Document FR-A-2 743 977 discloses a device of the abovementioned type, in which the board connectors of the chassis are fixed to a board secured to the chassis, called a motherboard, on the side of the chassis opposite the output connectors of the rack, and the removable boards, called daughterboards, are equipped with board connectors and output connectors arranged on opposite edges of the or each daughterboard.

This device facilitates the connection of the output connectors of the daughterboards and of the rack when the chassis is being inserted.

Nevertheless, with such a device, to remove a daughterboard, for example with a view to replacing it, it is necessary to remove the chassis from the rack, and to remove the daughterboard from the chassis. This complicates daughterboard maintenance or replacement operations.

An object of the invention is to propose an electronic board device facilitating the insertion and extraction of a board or a chassis containing one or more boards.

SUMMARY OF THE INVENTION

To this end, the invention proposes an electronic board device of the abovementioned type, characterized in that:

the chassis comprises an opening enabling the insertion of the or each board into the chassis according to a direction of insertion of the or each board into the chassis when the chassis has been inserted into the rack beforehand;

the direction of insertion of the or each board into the chassis inserted into the rack is substantially identical to the direction of insertion of the chassis into the rack; and the output connectors and the board connectors are arranged so as to connect up according to the direction of the or each board in the chassis inserted into the rack, such that the insertion of the or each board into the chassis, when the chassis has been inserted into the rack beforehand, brings about the respective connecting-up of the output connectors and the board connectors.

According to other embodiments, the electronic board device comprises one or more of the following features, taken in isolation or in any technically possible combination:

the chassis comprises an opening facing the or each output connector of the rack when the chassis is received in the rack, so as to enable the connecting-up of the output connector of the or each board received in the chassis with the or each output connector of the rack through the opening, the opening enabling the connecting-up of the output connectors is provided in a wall of the chassis at the front of the chassis considering the direction of insertion of the or each board into the chassis, the or each output connector of the rack is arranged along a wall of the rack at the front of the rack considering the direction of insertion of the chassis into the rack, the or each board connector of the chassis is arranged on a wall of the chassis at the front of the chassis considering the direction of insertion of the or each board into the chassis, the output connector of the or each board is arranged along an edge at the front of the or each board considering the direction of insertion of the or each board into the chassis, the board connector of the or each board is arranged along an edge at the front of the or each board considering the direction of insertion of the or each board into the chassis, the device has no connector fixed to the chassis and intended to connect up with a connector fixed to the rack, the opening in the chassis enabling the insertion of the or each board is located facing an opening in the rack enabling the insertion of the chassis, when the chassis is inserted into the rack.

BRIEF DESCRIPTION OF THE DRAWINGS

The invention and its advantages will be better understood on reading the following description, given purely by way of example and with reference to the accompanying drawings in which:

FIG. 1 is a lateral schematic view of an electronic board device in accordance with the invention; and FIGS. 2 and 3 are views similar to that of FIG. 1, illustrating, respectively, the extraction or insertion of an electronic board, and the extraction or insertion of a chassis containing electronic boards.

DESCRIPTION OF THE INVENTION

Figure 3:
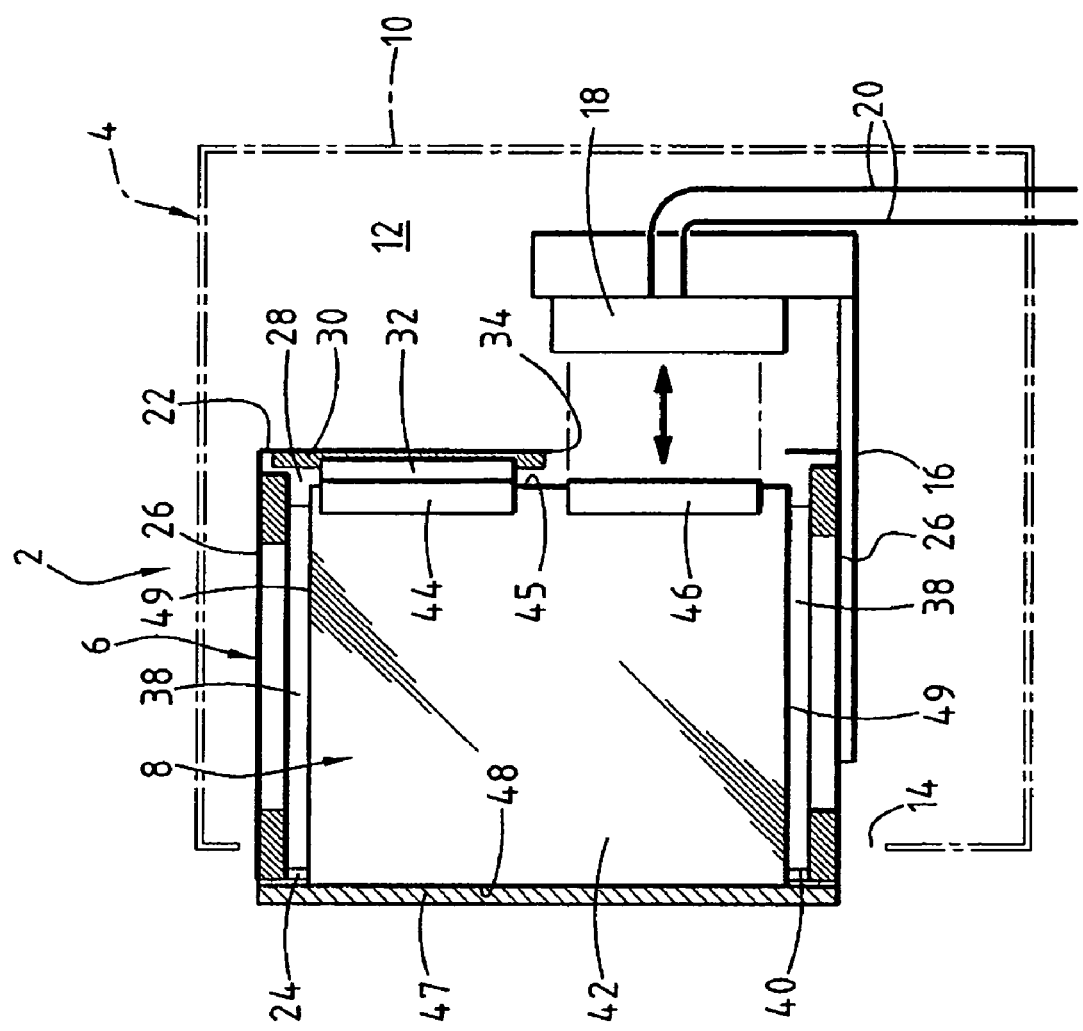

As represented in FIG. 1, the electronic board device 2 comprises a rack 4, a chassis 6 removably mounted in the rack 4, and several electronic boards 8, called daughterboards, removably mounted in the chassis 6, only one of them being visible in FIG. 1.

The rack 4 is for example a rack in an electronic cabinet, comprising a plurality of racks, of a locomotive, a machine tool, and more generally an electrical machine.

The rack 4 comprises an enclosure 10, represented schematically by a double dash-dotted outline, delimiting a housing 12 and having a rear opening 14.

The opening 14 enables the insertion of the chassis 6 into the rack 4 in a direction, from the left to the right in FIG. 1. Likewise, the opening 14 enables the extraction of the chassis 6 from the rack 4, in the opposite direction, i.e. from the right to the left in FIG. 1.

From now on in the description, the terms "front" and "rear" are understood by considering the direction of insertion of the chassis 6 into the rack 4.

The rack 4 comprises, in the housing 12, a supporting structure 16 and electrical output connectors 18, only one being visible, arranged at the front of the supporting structure 16, at the far end of the rack 4. Each connector 18 is connected to a remote electrical installation via electrical cable bundles 20.

The chassis 6 comprises a front far-end wall 22, a rear wall 24, and side walls 26 extending between the walls 22 and 24. The walls 22, 24 and 26 delimit a housing 28 for receiving the boards 8.

The chassis 6 comprises an electronic board 30, called the motherboard, which is fixed to an upper area of the wall 22.

The motherboard 30 comprises electrical board connectors 32, only one connector 32 being visible in FIG. 1.

The wall 22 has in a lower area a front opening 34, facing the connectors 18.

For mounting each board 8, the chassis 6 comprises an upper sliding rail 38 and a lower sliding rail 38 fixed to the walls 26, and extending from the rear to the front of the chassis 6.

The wall 24 has a rear opening 40 enabling the insertion of the boards 8 into the chassis 6 in a direction of insertion of the boards into the chassis 6 identical to the direction of insertion of the chassis 6 into the rack 4. The openings 40 and 14 face each other.

Each board 8 comprises a supporting plate 42 carrying electrical and/or electronic components. The boards 8 are substantially identical and differ from one another in the components they carry and in the way these components are interconnected.

Each board 8 comprises a board connector 44 and an output connector 46 both fixed to the same front edge 45 of the plate 42.

The connector 44 is connected up with a corresponding connector 32, and the connector 46 is connected up with a corresponding connector 18 through the opening 34.

The connectors 44 and 32, and the connectors 46 and 18 connect up with each other according to the direction of insertion of each board 8 into the chassis 6.

Each board 8 comprises a panel 47 fixed to a rear edge 48 of the plate 42, and has side edges 49 engaged in the sliding rails 38.

The chassis 6 and the rack 4 have no additional connectors fixed to the chassis 6 and the rack 4 and connecting up with each other when the chassis 6 is being inserted into the rack 4.

As illustrated in FIG. 2, it is possible to individually extract each board 8 from the chassis 6. To achieve this, the board 8 is pulled out rearwards through the openings 14 and 40 in the direction opposite the direction of insertion of the boards 8 into the chassis 6. As this takes place, the connectors 44 and 32 and the connectors 46 and 18 disconnect automatically and simultaneously from each other.

Similarly, it is possible to insert each board 8 into the chassis 6 through the openings 14 and 40, the chassis 6 having been received in the rack 4 beforehand. The insertion of the board 8 into the chassis 6 causes the board connectors 44 and 32, and the output connectors 46 and 18, to connect up simultaneously and automatically.

It is therefore possible to insert or extract each board 8 without removing the chassis 6 from the rack 4.

This is made possible in particular by the fact that the connectors 18 and 32 connect up with each other in the direction of insertion of each board 8 into the chassis 6 and disconnect in the opposite direction, and is facilitated by the arrangement of the connectors 44 and 46 of each board 8 on the edge 45, and of the corresponding connectors 18 and 32 at the far end of the chassis 6 when the latter is received in the rack 4.

As illustrated in FIG. 3, it is possible to remove the chassis 6 containing the boards 8 from the rack 4, through the opening 14.

As this takes place, the boards 8 remain in the chassis 4 and the connectors 32 and 44 remain connected together, while the connectors 46 and 18 are automatically disconnected.

Similarly, it is possible to insert the chassis 6 containing the boards 8 into the rack 6 through the opening 14. In that case, the chassis 6 is pushed in until the connectors 46 and 18 are connected together through the opening 34.

This is made possible in particular by the fact that the connectors 18 and 32 connect up with each other in the direction of insertion of the chassis 6 into the rack 4, and disconnect from each other in the opposite direction.

Therefore, with the device 2 it is possible to selectively remove a board 8 or the chassis 6 via simple operations.

The device 2 is economical insofar as the number of electrical connectors is reduced, and is hardly affected by electromagnetic interference insofar as the boards 8 are connected to the connector 18 directly, without the use of electrical wires.

Furthermore, the device 2 is compact given that the connectors 18 connect directly to the connectors 46 through the opening 34. The connectors 32 and 18 are protected given that they are located at the far end of the chassis 6 and of the rack 4, and they do not risk being damaged.

Furthermore, production and maintenance are simplified, and reliability is improved due to the limited use of electrical wires.

It is possible to provide a covering to close the opening 40 in the chassis 6, and a covering to close the opening 14 in the rack 4.

The invention claimed is:

1. An electronic board device, of the type comprising:
    a rack;
    a chassis that can be removably inserted into the rack according to a direction of insertion of the chassis into the rack;
    at least one electronic board that can be removably insertable into the chassis according to a direction of insertion of the electronic board into the chassis;
    a board electrical connector fixed to the electronic board and adapted to connect to a chassis electrical connector fixed to the chassis according to the direction of insertion of the board into the chassis; and
    a board output electrical connector fixed to the board and adapted to connect to a rack output electrical connector fixed to the rack according to the direction of insertion of the chassis beforehand into the rack;
    wherein the chassis comprises an opening enabling the insertion of the electronic board into the chassis inserted into the rack; and
    the direction of insertion of the electronic board into the chassis is substantially identical to the direction of insertion of the chassis into the rack when the chassis is inserted into the rack whereby
    when the electronic board is inserted beforehand into the chassis, the later insertion of the chassis into the rack brings about the connecting of the board output electrical connector to the rack output electrical connector, and when the chassis is inserted beforehand into the rack, the later insertion of the board into the chassis brings about the connecting of the board electrical connector to the chassis electrical connector and the connecting-up of the rack output electrical connector to the board output electrical connector.

2. The device according to claim 1 wherein the chassis includes a further opening facing the rack electrical output connector when the chassis is received in the rack, so as to enable the connection of the board electrical output connector received in the chassis with the rack electrical output connector through the further opening.

3. The device according to claim 2 wherein the further opening is provided in a wall of the chassis at the front of the chassis considering the direction of board insertion.

4. The device according to claim 2 wherein the rack electrical output connector is arranged along a wall of the rack at the front of the rack considering the direction of chassis insertion.

5. The device according to claim 2 wherein the chassis electrical board connector is arranged on a wall of the chassis at the front of the chassis considering the direction of board insertion.

6. The device according to claim 2 wherein the board electrical output connector is arranged along an edge at the front of the electronic board considering the direction of board insertion.

7. The device according to claim 2 wherein the board electrical board connector is arranged along an edge at the front of the board considering the direction of board insertion.

8. The device according to claim 2 wherein the chassis lacks a connector for directly connecting to the rack.

9. The device according to claim 2 wherein the opening is located facing a further opening in the rack enabling the insertion of the chassis, when the chassis is inserted into the rack.

10. The device according to claim 1 wherein at least one electric board removably insertable the chassis is a daughterboard, the chassis comprising an electronic motherboard fixed into the chassis, the chassis electrical connector being fixed to the electronic motherboard.

* * * * *